United States Patent [19]
Lee et al.

[11] Patent Number: 5,703,886
[45] Date of Patent: Dec. 30, 1997

[54] ERROR DETECTING APPARATUS FOR PACKET EXCHANGE

[75] Inventors: Seong Sam Lee; Yong Don Kwon, both of Kyoungki-do, Rep. of Korea

[73] Assignee: Hyundai Electronics Industries Co., Ltd., Kyoungki-Do, Rep. of Korea

[21] Appl. No.: 616,301

[22] Filed: Mar. 15, 1996

[30] Foreign Application Priority Data

Mar. 16, 1995 [KR] Rep. of Korea ............... 95-5489

[51] Int. Cl.$^6$ ............................................. H03M 13/00
[52] U.S. Cl. ............................................. 371/37.1
[58] Field of Search .................... 371/37.1; 395/182.02

[56] References Cited

U.S. PATENT DOCUMENTS 5,161,156  11/1992  Baum et al. ............... 395/182.02
5,353,352  10/1994  Dent et al. ..................... 380/37
5,436,915  7/1995   Loebig ........................... 371/36

Primary Examiner—Stephen M. Baker
Attorney, Agent, or Firm—Helfgott & Karas, P.C.

[57] ABSTRACT

An error detecting apparatus for a packet exchange in which a block coding technique capable of using a data width of 16 bits while using a bus width of 24 bits is applied to drive the common bus of the packet exchange, thereby not only obtaining a bit exchange speed being double that of a triplicated common bus, but also detecting errors and correcting the detected errors. The apparatus includes a pair of encoding units each adapted to encode data of 8 bits and four code bits for an error detection, thereby generating a coded vector of 12 bits, a common bus adapted to interface the 12-bit coded vectors respectively generated from the encoding units, and a pair of decoding units adapted to share the common bus with each other, thereby respectively receiving the coded 12-bit vectors, each decoding unit extracting original 8-bit data from the received 12-bit vector, thereby detecting and correcting errors.

4 Claims, 2 Drawing Sheets

ERROR DETECTING APPARATUS FOR PACKET EXCHANGE

BACKGROUND OF THE INVENTION

1. Field of the Invention

The present invention relates to error detection and correction for packet exchanges, and more particularly to an error detecting apparatus for a packet exchange in which a block coding technique is used to drive a common bus of the packet exchange, thereby achieving an error detection and correction.

2. Description of the Prior Art

In accordance with a data triplicating method which is a simple method for detecting and correcting errors generated in packet exchanges, 8-bit data is triplicated so that the common bus is driven with 24 bits. As at least two of the triplicated data are selected, the error detection and correction is carried out in the unit of 1 bit.

Where the common bus is driven at a speed of 10 MHz, the bit exchange speed of packet exchanges is 80 Mbps (bps; bit per second).

In existing packet exchanges, an increase in the capacity and speed is greatly required with such a bit exchange speed because code division multi-access mobile radio communications exchanges require a bit exchange speed of above 120 MbpS.

In order to achieve an increase in speed in conventional packet exchanges, two methods have been proposed.

One method is to increase the driving speed of the common bus, thereby obtaining a bit exchange speed of 120 Mbps. The other method is to increase the data width from 8 bits to 16 bits, thereby obtaining a bit exchange speed of 160 Mbps.

In accordance with these conventional methods, however, it is difficult to realize common buses driven at a speed of 10 MHz at the TTL level. Of course, this problem can be solved using the ECL level. In this case, however, expensive elements should be used. Moreover, the circuit arrangement is complex because the number of pins is doubled.

SUMMARY OF THE INVENTION

Therefore, an object of the invention is to provide an error detecting apparatus for a packet exchange in which a block coding technique capable of using a data width of 16 bits while using a bus width of 24 bits is applied to drive the common bus of the packet exchange, thereby not only obtaining a bit exchange speed being double that of a triplicated common bus, but also detecting errors and correcting the detected errors.

In accordance with the present invention, this object is accomplished by providing an error detecting apparatus for a packet exchange comprising: a pair of encoding means each adapted to encode data of 8 bits and four code bits for an error detection, thereby generating a coded vector of 12 bits; a common bus adapted to interface the 12-bit coded vectors respectively generated from the encoding means; and a pair of decoding means adapted to share the common bus with each other, thereby respectively receiving the coded 12-bit vectors, each decoding means extracting original 8-bit data from the received 12-bit vector, thereby detecting and correcting errors.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
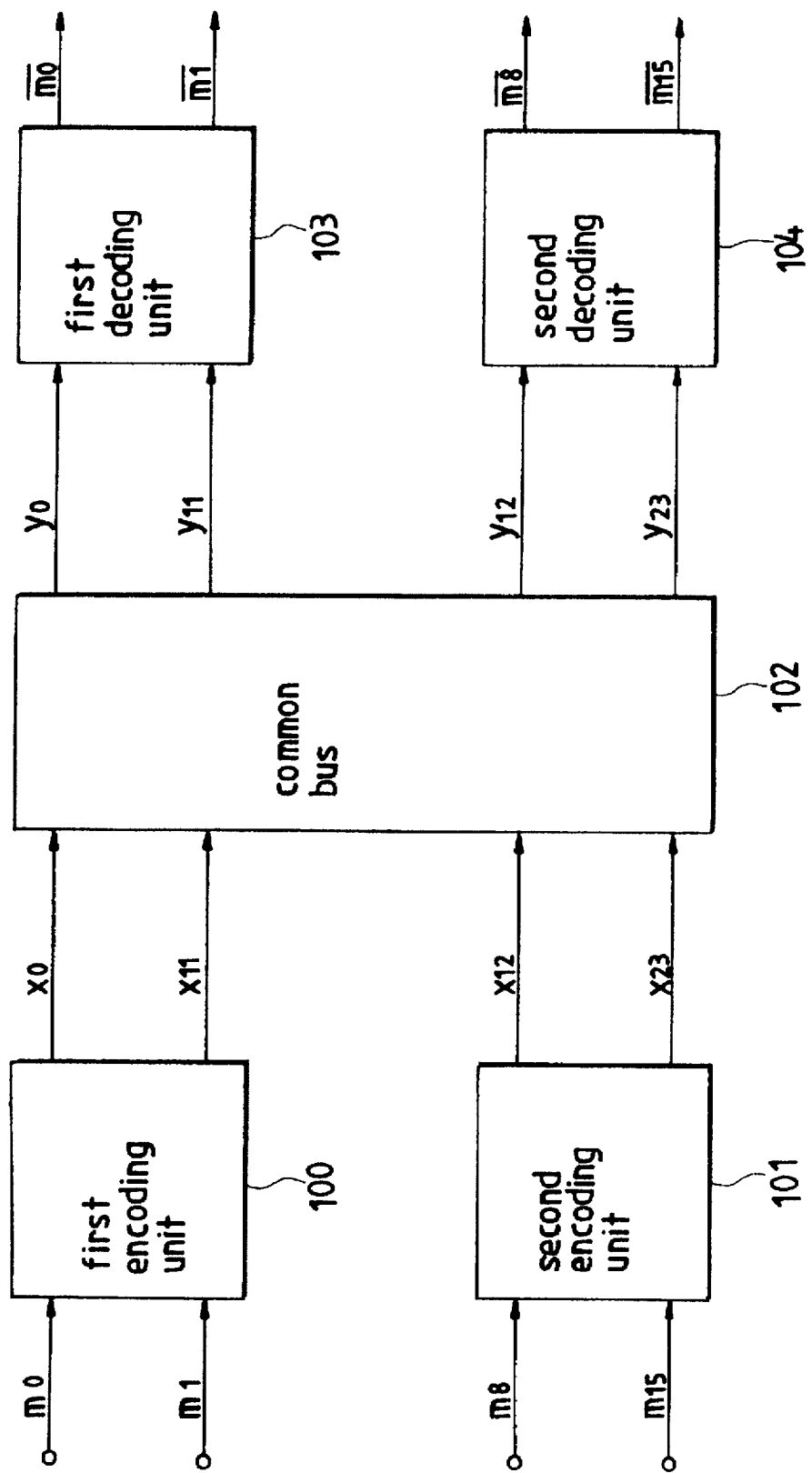
FIG. 1 is a block diagram illustrating an error detecting apparatus for a packet exchange in accordance with the present invention.

FIG. 1 illustrates an error detecting apparatus for a packet exchange in accordance with the present invention.

As shown in FIG. 1, the error detecting apparatus includes a pair of encoding units 100 and 101. The first encoding unit 100 encodes data of 8 bits m0 to m7 and four code bits for the error detection, thereby generating a coded vector of 12 bits x0 to x11 whereas the second encoding unit 101 encodes data of 8 bits m8 to m15 and four code bits for the error detection, thereby generating a coded vector of 12 bits x12 to x23. The error detecting apparatus also includes a common bus 102 for interfacing the coded vector of 12 bits x0 to x11 generated from the first encoding unit 100 and the coded vector of 12 bits x12 to x23 generated from the second encoding unit 101. The error detecting apparatus further includes a pair of decoding units 103 and 104 which share the common bus 102 with each other, thereby respectively receiving the coded 12-bit vectors. The first decoding unit 103 extracts original data of 8 bits $\overline{m0}$ to $\overline{m7}$ from the received vector of 12 bits y0 to y11 whereas the second decoding unit 104 extracts original data of 8 bits $\overline{m8}$ to $\overline{m15}$ from the received vector of 12 bits y12 to y23. Based on the extracted 8-bit data, the decoding units 103 and 104 detect and correct errors.

Figure 2:
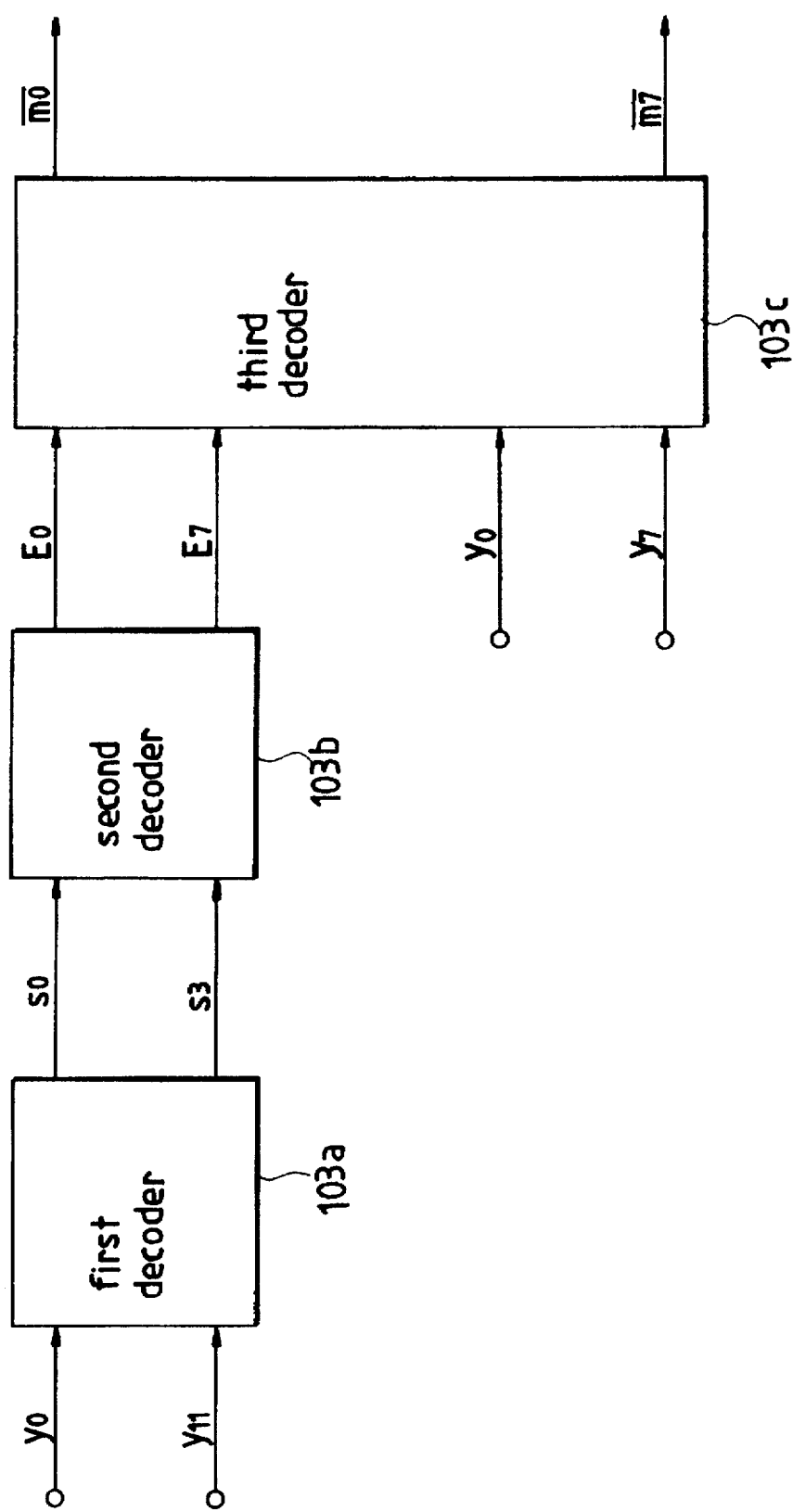
FIG. 2 is a block diagram illustrating a first decoding unit included in the apparatus of FIG. 1.

As shown in FIG. 2, the first decoding unit 103 includes a first decoder 103a for exclusively logically operating the vector of 12 bits y0 to y11 received through the common bus 102, thereby generating four code bits s0 to s3, a second decoder 103b for logically multiplying the four code bits s0 to s3 generated from the first decoder 103a, thereby generating eight code bits E0 to E7, and a third decoder 103c for exclusively logically operating the eight code bits E0 to E7 generated from the second decoder 103b and the vector of 8 bits y0 to y7 received through the common bus 102, thereby extracting original data of 8 bits $\overline{m0}$ to $\overline{m7}$.

Now, the operation of the error detecting apparatus for the packet exchange in accordance with the present invention will be described in conjunction with FIGS. 1 and 2.

When data of 16 bits m0 to m15 input at input terminals of the error detecting apparatus are applied to the first and second encoding units 100 and 101 by 8 bits. The first encoding unit 100 encodes the data of 8 bits $\overline{m0}$ to $\overline{m7}$ received thereto with four code bits for the error correction, thereby generating a coded vector of 12 bits x0 to x11. On the other hand, the second encoding unit 101 encodes the data of 8 bits $\overline{m8}$ to $\overline{m15}$ received thereto with four code bits for the error correction, thereby generating a coded vector of 12 bits x12 to x23.

In this case, an encoding function G used in each encoding unit is as follows:

| G = 1 0 0 0 0 0 0 0 | 0 0 1 1 |
|---|---|
| 0 1 0 0 0 0 0 0 | 0 1 0 1 |
| 0 0 1 0 0 0 0 0 | 0 1 1 0 |
| 0 0 0 1 0 0 0 0 | 1 0 0 1 |
| 0 0 0 0 1 0 0 0 | 1 0 1 0 |
| 0 0 0 0 0 1 0 0 | 1 1 0 0 |
| 0 0 0 0 0 0 1 0 | 1 1 0 1 |
| 0 0 0 0 0 0 0 1 | 1 1 1 0 |

Assuming that X is the encoded vector generated from each encoding unit, and M is a data (message) vector, the encoded vector X generated from each encoding unit can be expressed by "X=MG".

That is, the coded vector of 12 bits x0 to x11 output from the first encoding unit 100 can be expressed as follows:

x0=m0, x1=m1, x2=m2, x3=m3, x4=m4, x5=m5, x6=m6, x7=m7, x8=$\overline{m3_{61} \ m4_{61} \ m5_{61} \ m6_{61} \ m7}$, x9=$\overline{m1_{61} \ m2_{61} \ m5_{61} \ m6_{61} \ m7}$, x10=$\overline{m0_{61} \ m2_{61} \ m4_{61} \ m7}$.

x11=$\overline{m0_{61} \ m1_{61} \ m3_{61} \ m6}$

These coded vectors are transmitted to the first and second decoding units 103 and 104 through the common bus 102, respectively.

The first decoding unit 103 decodes the vector of 12 bits y0 to y11 received through the common bus 102, thereby extracting original data of 8 bits $\overline{m0}$ to $\overline{m7}$. On the other hand, the second decoding unit 104 decodes the vector of 12 bits y12 to y23 received through the common bus 102, thereby extracting original data of 8 bits $\overline{m8}$ to $\overline{m15}$.

The operations of the first and second decoding units 103 and 104 will be described in more detail in conjunction with FIG. 2.

The first decoder 103a of the first decoding unit 103 exclusively logically operates the vector of 12 bits y0 to y11 received thereto through the common bus 102, thereby generating four code bits s0 to s3.

That is, the vector of 12 bits y0 to y11 are exclusively logically operated, thereby generating four code bits s0 to s3 as follows:

s0=$y3_{61} \ y4_{61} \ y5_{61} \ y6_{61} \ y7_{61} \ y8$, s1=$y1_{61} \ y2_{61} \ y5_{61} \ y6_{61} \ y7_{61} \ y8$, s2=$y0_{61} \ y2_{61} \ y4_{61} \ y7_{61} \ y10$, s3=$y0_{61} \ y1_{61} \ y3_{61} \ y6_{61} \ y11$

These four code bits s0 to s3 from the first decoder 103a is then applied to the second decoder 103b.

The Second decoder 103b logically multiplies the four code bits s0 to S3 received thereto, thereby generating eight code bits E0 to E7.

The eight code bits E0 to E7 are as follows:

$E_0 = \overline{S_0} \cdot \overline{S_1} \cdot S_2 \cdot S_3$, $E_1 = \overline{S_0} \cdot S_1 \cdot \overline{S_2} \cdot S_3$, $E_2 = \overline{S_0} \cdot S_1 \cdot S_2 \cdot \overline{S_3}$, $E_3 = S_0 \cdot \overline{S_1} \cdot \overline{S_2} \cdot S_3$, $E_4 = S_0 \cdot \overline{S_1} \cdot S_2 \cdot \overline{S_3}$, $E_5 = S_0 \cdot S_1 \cdot \overline{S_2} \cdot \overline{S_3}$, $E_6 = S_0 \cdot S_1 \cdot \overline{S_2} \cdot S_3$, $E_7 = S_0 \cdot S_1 \cdot S_2 \cdot \overline{S_3}$, The eight code bits E0 to E7 from the second decoder 103b are then applied to the third decoder 103c.

The third decoder 103c exclusively logically operates the eight code bits E0 to E7 received from the second decoder 103b with the vector of 8 bits y0 to y7 received through the common bus 102, thereby extracting original data of 8 bits $\overline{m0}$ to $\overline{m7}$.

That is, the third decoder 103c decodes each of the 8 code bits, Ei, and each corresponding one of the data vector, yi, (Ei$_{61}$ yi=mi), thereby carrying out the error detection and correction in the unit of one bit. In such a manner, original data of 8 bits is extracted.

Accordingly, the first and second decoding unit 103 and 104 extract reliable original data of 8 bits $\overline{m0}$ to $\overline{m7}$ and $\overline{m8}$ to $\overline{m15}$ from the vector of 12 bits y0 to y11 and y12 to y23 received from the first and second encoding units 100 and 101, respectively.

As apparent from the above description, the present invention provides an error detecting apparatus for a packet exchange in which a block coding technique capable of using a data width of 16 bits while using a bus width of 24 bits is applied to drive the common bus of the packet exchange, thereby not only obtaining a bit exchange speed being double that of a triplicated common bus, but also detecting errors and correcting the detected errors.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An error detecting apparatus for a packet exchange comprising:

a pair of encoding means each adapted to encode 8-bit data and four code bits for an error detection, thereby generating a 12-bit coded vector;

a common bus adapted to interface the 12-bit coded vectors respectively generated from the encoding means; and a pair of decoding means adapted to share the common bus with each other, thereby respectively receiving the coded 12-bit vectors, each decoding means extracting original 8-bit data from the received 12-bit vector, thereby detecting and correcting errors.

2. The error detecting apparatus in accordance with claim 1, wherein a first one of decoding means comprises:

a first decoder for exclusively logically operating the 12-bit vector received through the common bus, thereby generating four code bits;

a second decoder for logically multiplying the four code bits generated from the first decoder, thereby generating eight code bits; and a third decoder for exclusively logically operating the eight code bits generated from the second decoder and the 8-bit vector received through the common bus, thereby extracting original 8-bit data.

3. The error detecting apparatus in accordance with claim 2, wherein the first decoder carries out a decoding operation for generating the four code bits in the following manner:

s0=$y3_{61} \ y4_{61} \ y5_{61} \ y6_{61} \ y7_{61} \ y8$, s1=$y1_{61} \ y2_{61} \ y5_{61} \ y6_{61} \ y7_{61} \ y8$, s2=$y0_{61} \ y2_{61} \ y4_{61} \ y7_{61} \ y10$, s3=$y0_{61} \ y1_{61} \ y3_{61} \ y6_{61} \ y11$ where, yi represents the 8-bit vector received through the common bus, and s0 to s3 represent four code bits respectively output from the first decoder.

4. The error detecting apparatus in accordance with claim 2, wherein the second decoder carries out a decoding operation for generating the eight code bits in the following manner:

$E_0 = \overline{S_0} \cdot \overline{S_1} \cdot S_2 \cdot S_3$, $E_1 = \overline{S_0} \cdot S_1 \cdot \overline{S_2} \cdot S_3$, $E_2 = \overline{S_0} \cdot S_1 \cdot S_2 \cdot \overline{S_3}$, $E_3 = S_0 \cdot \overline{S_1} \cdot \overline{S_2} \cdot S_3$, $E_4 = S_0 \cdot \overline{S_1} \cdot S_2 \cdot \overline{S_3}$, $E_5 = S_0 \cdot S_1 \cdot \overline{S_2} \cdot \overline{S_3}$, $E_6 = S_0 \cdot S_1 \cdot \overline{S_2} \cdot S_3$, $E_7 = S_0 \cdot S_1 \cdot S_2 \cdot \overline{S_3}$, where, s0 to s3 represent input code bits, respectively, and E0 to E7 represent eight code bits respectively output from the second decoder.

* * * * *